(12) United States Patent
Griswold et al.

(10) Patent No.: US 10,705,168 B2
(45) Date of Patent: Jul. 7, 2020

(54) SYSTEM AND METHOD FOR LOW RANK APPROXIMATION OF HIGH RESOLUTION MRF THROUGH DICTIONARY FITTING

(71) Applicant: Case Western Reserve University, Cleveland, OH (US)

(72) Inventors: Mark A. Griswold, Shaker Heights, OH (US); Mingrui Yang, Cleveland, OH (US); Debra McGivney, Rocky River, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 130 days.

(21) Appl. No.: 15/873,781

(22) Filed: Jan. 17, 2018

(65) Prior Publication Data
US 2018/0203082 A1 Jul. 19, 2018

Related U.S. Application Data

(60) Provisional application No. 62/447,304, filed on Jan. 17, 2017.

(51) Int. Cl.
*G01R 33/56* (2006.01)
*G01R 33/54* (2006.01)
*G06F 16/56* (2019.01)
*G06F 16/583* (2019.01)

(52) U.S. Cl.
CPC ......... *G01R 33/54* (2013.01); *G01R 33/5608* (2013.01); *G06F 16/56* (2019.01); *G06F 16/5838* (2019.01)

(58) Field of Classification Search
CPC .... G01R 33/54; G01R 33/5608; G01R 33/50; G01R 33/543; G01R 33/448; G06F 16/56; G06F 16/5838
USPC .......................................................... 324/309
See application file for complete search history.

(56) References Cited

U.S. PATENT DOCUMENTS

| 8,723,518 | B2 | 5/2014 | Seiberlich | |
| 9,633,455 | B1 * | 4/2017 | Mailhe | ................. G06T 11/008 |
| 2013/0265047 | A1 * | 10/2013 | Griswold | ............... G01R 33/56 |
| | | | | 324/309 |

(Continued)

OTHER PUBLICATIONS

Buonincontri G, et al. MR fingerprinting with simultaneous B1 estimation. Magn Reson Med 2016;76:1127-1135.

(Continued)

*Primary Examiner* — Patrick Assouad
*Assistant Examiner* — Demetrius R Pretlow
(74) *Attorney, Agent, or Firm* — Quarles & Brady LLP

(57) ABSTRACT

A system and method is provided for generating a map of a tissue property in a subject using magnetic resonance fingerprinting (MRF) and a compressed MRF dictionary, where the compressed MRF dictionary has a significantly reduced memory requirement relative to a standard MRF dictionary. The method includes performing a randomized singular value decomposition (rSVD) on a MRF dictionary to produce the compressed MRF dictionary. MRF data is then acquired and compared to the MRF dictionary to identify the tissue property from the region of interest in the subject. A tissue property map is then generated based on the tissue in the region of interest of the subject.

25 Claims, 11 Drawing Sheets
(6 of 11 Drawing Sheet(s) Filed in Color)

(56) References Cited

U.S. PATENT DOCUMENTS

| | | | | |
|---|---|---|---|---|
| 2013/0271132 | A1* | 10/2013 | Griswold | G01R 33/5612 |
| | | | | 324/309 |
| 2014/0167754 | A1* | 6/2014 | Jerecic | G01R 33/561 |
| | | | | 324/309 |
| 2015/0301141 | A1 | 10/2015 | Griswold | |
| 2015/0302579 | A1* | 10/2015 | Griswold | G01R 33/5608 |
| | | | | 382/128 |
| 2015/0346301 | A1* | 12/2015 | Cauley | G01R 33/4828 |
| | | | | 324/309 |
| 2016/0349339 | A1* | 12/2016 | Brady-Kalnay | G01R 33/50 |
| 2017/0011255 | A1* | 1/2017 | Kaditz | G01R 33/48 |
| 2017/0115368 | A1* | 4/2017 | Chen | G01R 33/4824 |
| 2017/0319098 | A1* | 11/2017 | Wang | G01R 33/4625 |
| 2018/0068469 | A1* | 3/2018 | Yui | G06T 7/11 |
| 2018/0203081 | A1* | 7/2018 | Cohen | G01R 33/4828 |
| 2019/0033413 | A1* | 1/2019 | Amthor | G01R 33/4824 |
| 2019/0137585 | A1* | 5/2019 | Bornert | G01R 33/4816 |
| 2019/0365982 | A1* | 12/2019 | Uber, III | G01R 33/5601 |

OTHER PUBLICATIONS

Cauley SF, et al. Fast group matching for MR fingerprinting reconstruction. Magn Reson Med 2015;74:523-528.

Chen Y, et al. 3D magnetic resonance fingerprinting for quantitative breast imaging. In Proceedings of the 24th Annual Meeting of ISMRM, Singapore, 2016. Abstract 0399.

Chen Y, et al. Free-breathing 3D abdominal magnetic resonance fingerprinting using navigators. In Proceedings of the 24th Annual Meeting of ISMRM, Singapore, 2016. Abstract 0716.

Cline CC, et al. AIR-MRF: accelerated iterative reconstruction for magnetic resonance fingerprinting. In Proceedings of the 24th Annual Meeting of ISMRM, Singapore, 2016. Abstract 0434.

Cloos MA, et al. Magnetic resonance fingerprint compression. In Proceedings of the 23rd Annual Meeting of ISMRM, Toronto, Canada, 2015. Abstract 0330.

Cloos MA, et al. Multiparametric imaging with heterogeneous radiofrequency fields. Nat Commun 2016;7:12445.

Cohen O, et al. In vivo optimized fast MR fingerprinting in the human brain. In Proceedings of the 24th Annual Meeting of ISMRM, Singapore, 2016. Abstract 0430.

Doneva M, et al. Low rank matrix completion-based reconstruction for undersampled magnetic resonance fingerprinting data. In Proceedings of the 24th Annual Meeting of ISMRM, Singapore, 2016. Abstract 0432.

Duyn JH, et al. Simple correction method for k-space trajectory deviations in MRI. J Magn Reson 1998; 132:150-153.

Erichson, N. B., et al. "Randomized matrix decompositions using R." arXiv preprint arXiv:1608.02148 (2016).

Fessler JA, et al. Nonuniform fast fourier transforms using min-max interpolation. IEEE Trans Signal Process 2003;51:560-574.

Gomez PA, et al. 3D magnetic resonance fingerprinting with a clustered spatiotemporal dictionary. In Proceedings of the 24th Annual Meeting of ISMRM, Singapore, 2016. Abstract 0251.

Griswold MA, et al. The use of an adaptive reconstruction for array coil sensitivity mapping and intensity normalization. In Proceedings of the 10th Annual Meeting of ISMRM, Honolulu, Hawaii, USA, 2002. p. 2410.

Halko, N. et al, Finding Structure with Randomness: Probabilistic Algorithms for Constructing Approximate Matrix Decompositions, SIAM Review 2011 53:2, 217-288.

Hamilton, J. et al, MR Fingerprinting with Chemical Exchange (MRF-X) for In Vivo Multi-Compartment Relaxation and Exchange Rate Mapping, Proc. Intl. Soc. Mag. Reson. Med. 24 (2016), 0431.

Jiang, Y., et al, MR fingerprinting using fast imaging with steady state precession (FISP) with spiral readout. Magn. Reson. Med. 2015, 74: 1621-1631.

Johnson WB, et al. Extensions of Lipschitz mappings into a Hilbert space. Contemp Math 1984;26:189-206.

Ma, et al., in "Magnetic Resonance Fingerprinting," Nature, 2013; 495(7440):187-192.

McGivney, D.F., et al, SVD Compression for Magnetic Resonance Fingerprinting in the Time Domain. IEEE Transactions on Medical Imaging, vol. 33, No. 12, pp. 2311-2322, Dec. 2014.

Pahwa S, et al. Application of magnetic resonance fingerprinting (MRF) for assessment of rectal cancer: a feasibility study. In Proceedings of the 24th Annual Meeting of ISMRM, Singapore, 2016. Abstract 2966.

Schmitt P, et al. A simple geometrical description of the TrueFISP ideal transient and steady-state signal. Magn Reson Med 2006;55:177-186.

Walsh DO, et al. Adaptive reconstruction of phased array MR imagery. Magn Reson Med 2000;43:682-690.

Zhang X, et al. MR Fingerprinting reconstruction with Kalman filter. In Proceedings of the 24th Annual Meeting of ISMRM, Singapore, 2016. Abstract 0436.

Zhao B, et al. A model-based approach to accelerated magnetic resonance fingerprinting time series reconstruction. In Proceedings of the 24th Annual Meeting of ISMRM, Singapore, 2016. Abstract 0871.

Zhao B, et al. Optimal experiment design for magnetic resonance fingerprinting. In Proceedings of the 38th Annual International Conference of the IEEE Engineering in Medicine and Biology Society (EMBC), Orlando, Florida, USA 2016. p. 453-456.

* cited by examiner

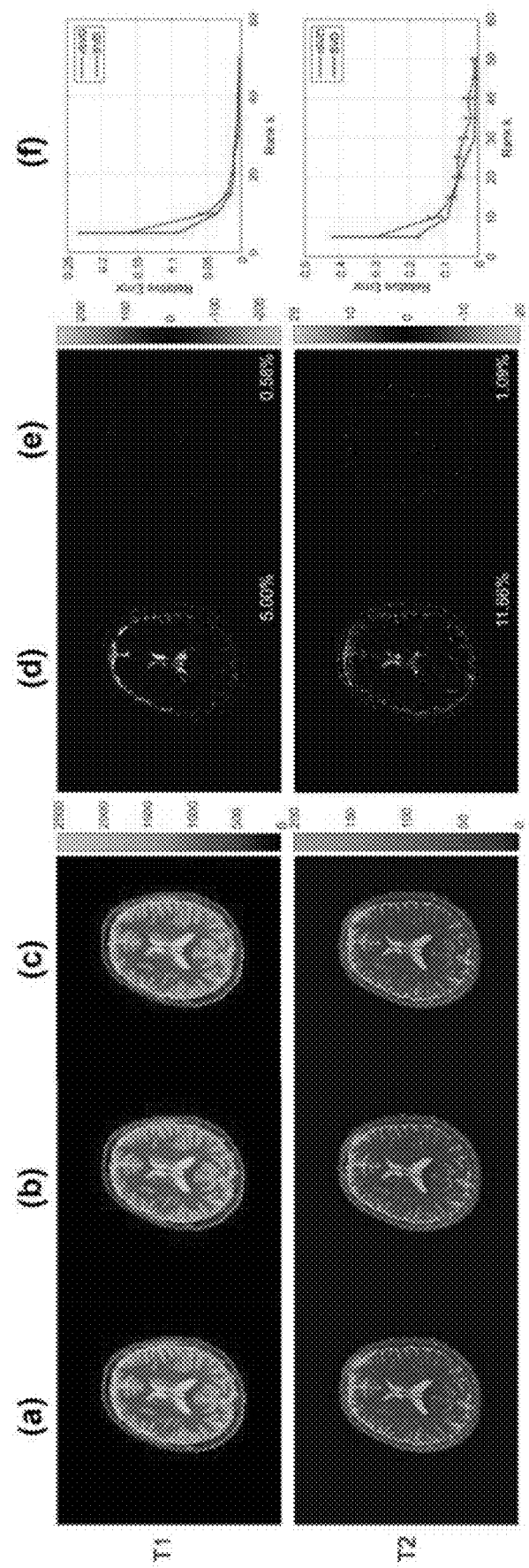
FIG. 7 (a-f)

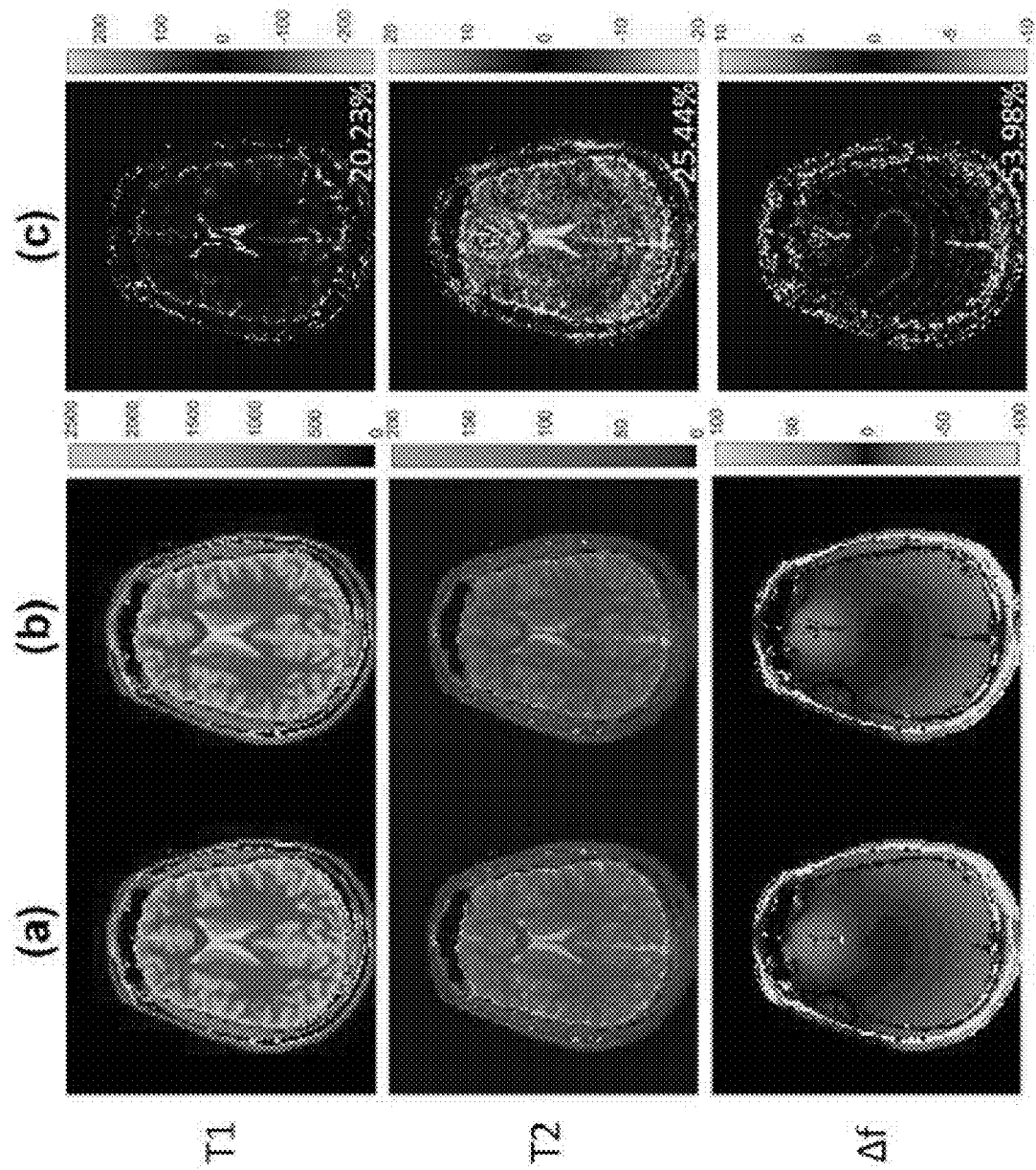
FIG. 8 (a-c)

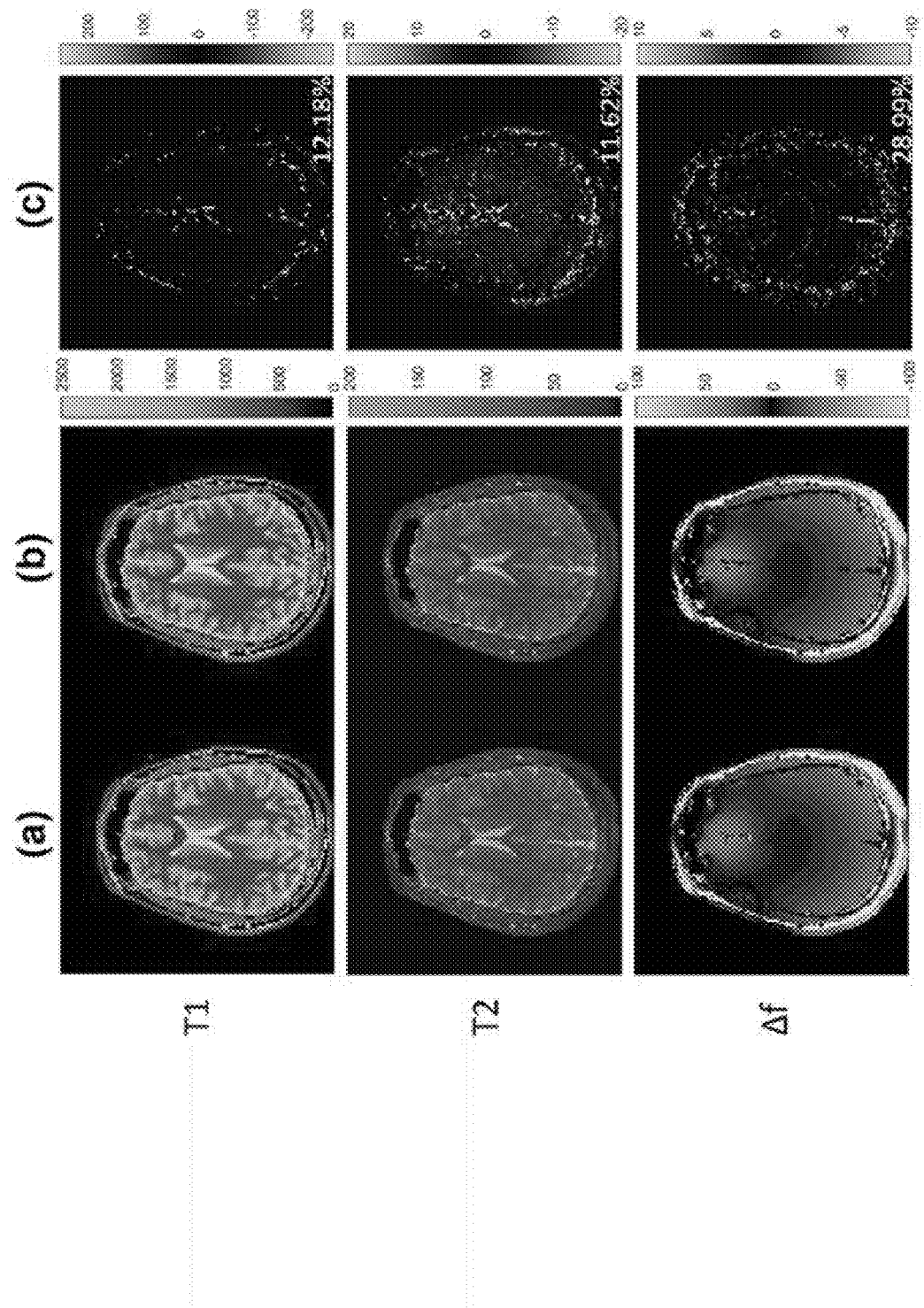
FIG. 9 (a-c)

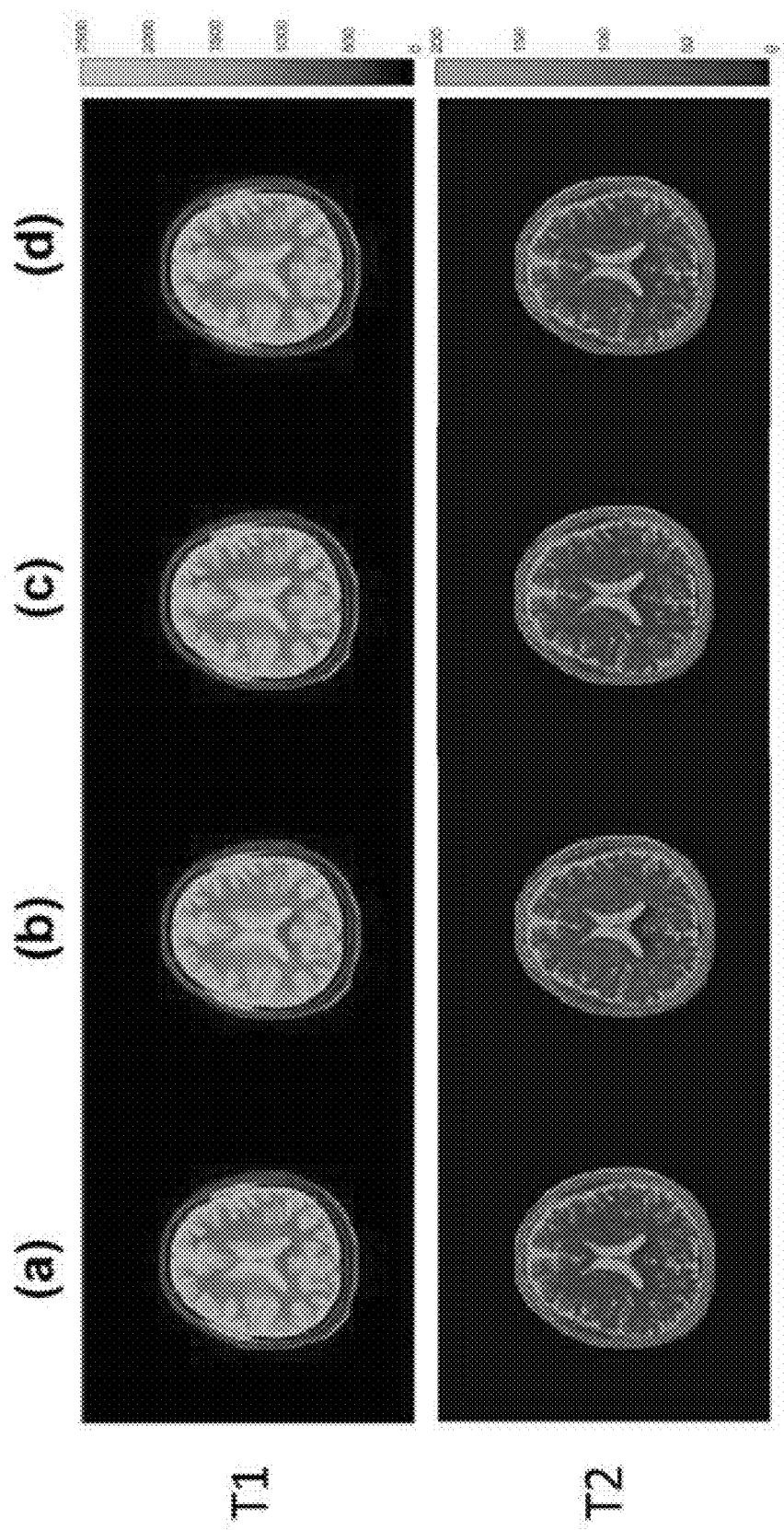
FIG. 10 (a-d)

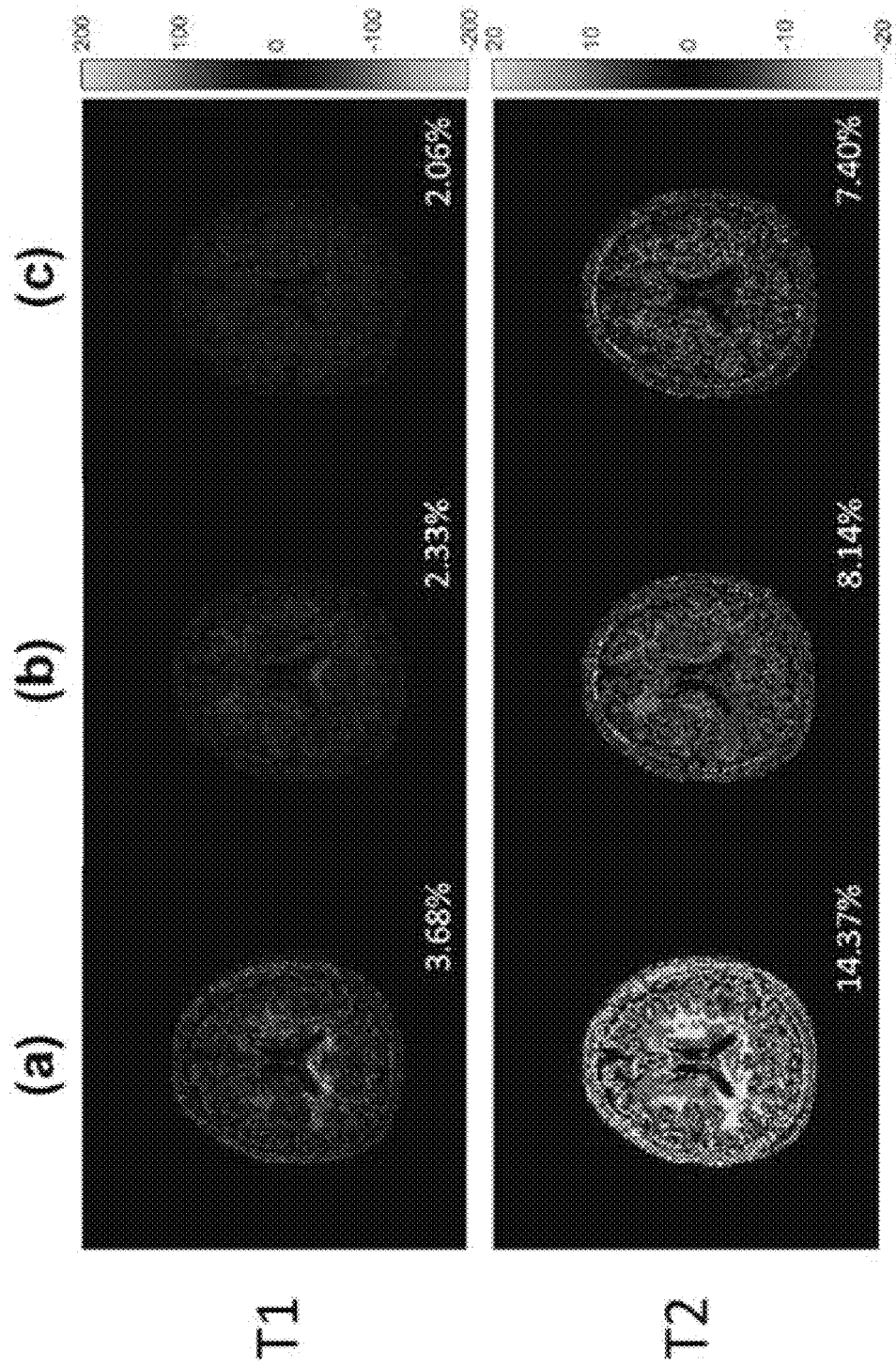
FIG. 11 (a-c)

SYSTEM AND METHOD FOR LOW RANK APPROXIMATION OF HIGH RESOLUTION MRF THROUGH DICTIONARY FITTING

CROSS-REFERENCE TO RELATED APPLICATIONS

This application is based on, claims the benefit of, and incorporates herein by reference, U.S. Provisional Patent Application 62/447,304, filed Jan. 17, 2017.

STATEMENT REGARDING FEDERALLY SPONSORED RESEARCH

This invention was made with government support under EB016728 and EB017219 awarded by National Institutes of Health. The government has certain rights in the invention.

BACKGROUND

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MW") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Magnetic resonance fingerprinting ("MRF") is a technology, which is described, as one example, by D. Ma, et al., in "Magnetic Resonance Fingerprinting," Nature, 2013; 495 (7440):187-192, that allows one to characterize tissue species using nuclear magnetic resonance ("NMR"). MRF can identify different properties of a resonant species (e.g., T1 spin-lattice relaxation, T2 spin-spin relaxation, proton density) to thereby correlate this information to quantitatively assess tissue properties. Other properties like tissue types and super-position of attributes can also be identified using MRF. These properties and others may be identified simultaneously using MRF.

In particular, unlike conventional MRI, MRF employs a series of varied sequence blocks (e.g., variable acquisition parameters) to gather tissue information based on unique signal evolutions generated in different resonant species (e.g., tissues) to which a radio frequency ("RF") is applied. The signals from different resonant tissues will, however, be different and can be distinguished using MRF techniques. The different signals can be collected over a period of time to identify a signal evolution within a voxel. Resonant species in the voxel can then be characterized by comparing the signal evolution to known evolutions, for example, by comparing acquired signal evolutions to known evolutions using a pattern matching algorithm. Characterizing the resonant species may include identifying a material and tissue type. Alternatively, characterizing the resonant species may include identifying MR parameters associated with the resonant species. The "known" evolutions may be, for example, simulated evolutions calculated from physical principles and/or previously acquired evolutions. A large set of known evolutions may be stored in a MRF dictionary.

One of the challenges associated with the MRF dictionary approach is the large amount of data that is generated. In particular instances, such as when fine MRF dictionaries are needed or multiple components are taken into account (i.e. chemical exchange effects), the number of elements in an MRF dictionary can approach billions. In these cases, the process of making, storing, loading, and processing MRF dictionaries can become difficult even when using modern computers.

Currently, there is a need in the art to reduce the memory requirement and improve the efficiency of producing and using MRF dictionaries.

SUMMARY OF THE DISCLOSURE

The present disclosure provides a system and method for generating high resolution magnetic resonance fingerprinting (MRF) tissue parameter maps using a compressed MRF dictionary. The compressed MRF dictionary is generated using a randomized singular value decomposition (rSVD) of a MRF dictionary. The compressed MRF dictionary produces tissue parameter maps (e.g., $T_1$, $T_2$, and off-resonance maps) that are in agreement with standard approaches, and produced using a significantly reduced memory requirement. In some forms, the rSVD method is combined with a polynomial fitting method to further compress the MRF dictionary. The approaches presented herein lead to significant memory savings, and in some instances can compress the memory requirement of an MRF dictionary by 1000 times the original size.

In one aspect, the present disclosure provides a method for generating a map of a tissue property in a subject using magnetic resonance fingerprinting (MRF) and a compressed MRF dictionary. The method includes first accessing a compressed MRF dictionary with a MRF system, where the compressed MRF dictionary is generated by performing a randomized singular value decomposition (rSVD) on a MRF dictionary. The compressed MRF dictionary is configured to comprise a series of singular vectors and a series of singular values from the MRF dictionary. Subsequently, MRF data is acquired using a MRF system, and the MRF data is compared to the compressed MRF dictionary to identify the tissue property from the region of interest. A tissue property map is then generated based on the tissue in the region of interest of the subject. In another aspect, the present disclosure provides a method for generating a map of a tissue property in a subject using magnetic resonance fingerprinting (MRF) and a fitted MRF dictionary. The method includes acquiring MRF data from a region of interest in a subject by performing a pulse sequence using a series of varied sequence blocks to elicit a series of signal evolutions. A fitted MRF dictionary is generated by applying curve fitting to at least a portion of a MRF dictionary, and the fitted MRF dictionary is compared to the MRF data to generate a tissue property map from the region of interest.

In one aspect, the present disclosure provides a magnetic resonance fingerprinting (MRF) system. The MRF system includes a magnet system configured to generate a polarizing magnetic field about at least a portion of a subject. The MRF system further includes a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals from the subject using a coil array. The MRF system also includes a computer system programmed to access a compressed MRF dictionary with the MRF system, where the compressed MRF dictionary is generated by performing a randomized singular value decomposition (rSVD) on a MRF dictionary. The compressed MRF dictionary is configured to comprise a series of singular vectors and a series of singular values from the MRF dictionary. Subsequently, the MRF system acquires MRF data from the region of interest, and the MRF data is compared to the compressed MRF dictionary to identify the tissue property from the region of interest. A tissue property map is then generated based on the tissue in the region of interest of the subject.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

The patent or patent application file contains at least one drawing in color. Copies of this patent or patent application publication with color drawings will be provided by the Office upon request and payment of the necessary fee.

FIGS. 7A-F are a comparison of tissue property maps generated with a compressed MRF dictionary and a standard MRF dictionary; (a) MRF tissue property maps generated without compression; (b) MRF tissue property maps generated using rSVD-MRF with k=10; (c) MRF tissue property maps generated using rSVD-MRF with k=30; (d) MRF difference maps between (a) and (b); (e) MRF difference maps between (a) and (c); (f) Reconstruction fidelity comparison between SVD and rSVD, both against tissue MRF maps without compression.

FIGS. 8A-C are a comparison of tissue property maps generated with a compressed MRF dictionary and a standard MRF dictionary; (a) MRF tissue property maps generated without compression; (b) MRF tissue property maps generated using rSVD-MRF with k=100 and q=0; (c) MRF difference maps between (a) and (b).

FIG. 9A-C are a comparison of tissue property maps generated with a compressed MRF dictionary and a standard MRF dictionary; (a) MRF tissue property maps generated without compression; (b) MRF tissue property maps generated using rSVD-MRF with k=100 and q=2; (c) MRF difference maps between (a) and (b).

FIGS. 10A-D are a series of T1, T2 maps of brain data against different MRF-FISP dictionaries; (a) MRF tissue maps with a finely compressed MRF dictionary; (b): MRF with a coarsely compressed dictionary; (c) MRF with a piecewise linear interpolated coarsely compressed MRF dictionary; (d) MRF with polynomial fitted compressed coarse dictionary.

FIGS. 11A-C are a series of T1, T2 difference maps of a brain data between different MRF-FISP dictionaries; (a) MRF difference maps between (a) and (b) from FIG. 10; (b) MRF difference maps between (a) and (c) from FIG. 10; (c) MRF difference maps between (a) and (d) form FIG. 10. Note the scaling factor changes in both T1 and T2 cases.

DETAILED DESCRIPTION

Figure 1:
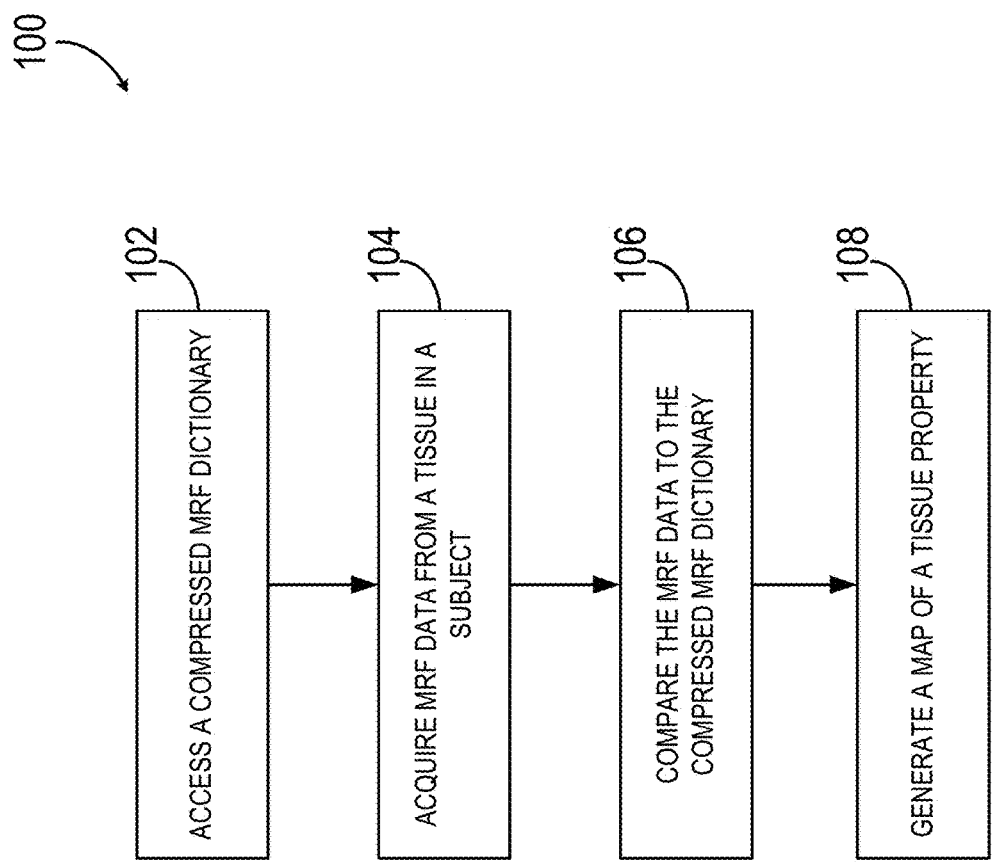
FIG. 1 is a schematic flow chart illustrating one non-limiting example of a process for compressing a MRF dictionary in accordance with the present disclosure.

Magnetic resonance fingerprinting ("MRF") is a technique that facilitates mapping of tissue or other material properties based on random, pseudorandom, or otherwise varied measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The random, pseudorandom, or otherwise varied measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. In some instances, the acquisition parameters can be varied according to a non-random or a non-pseudorandom pattern that otherwise results in signals from different materials or tissues to be spatially incoherent, temporally incoherent, or both.

From these measurements, MRF processes can be designed to map a wide variety of parameters that may be mapped individually or simultaneously. Examples of such parameters include, but are not limited to, longitudinal relaxation time (T$_1$), transverse relaxation time (T$_2$), main or static magnetic field map (B$_0$), and proton density (PD). Unlike conventional MR systems, tissue property maps may be generated simultaneously using MRF. Thus, rather than subjecting a patient to multiple serial acquisitions that may take a half hour or more, the patient may experience a much shorter time in the bore. Similarly, rather than making a radiologist wait for multiple images that are produced serially (e.g, a first pulse sequence to generate a T$_1$ map, a second pulse sequence to generate a T$_2$ map), the radiologist may be provided with maps that are produced simultaneously from the MRF data.

Examples of such parameters include, but are not limited to, longitudinal relaxation time (T$_1$), transverse relaxation time (T$_2$), main or static magnetic field map (B$_0$), and proton density (PD). MRF is generally described in U.S. Pat. No. 8,723,518 and Published U.S. Patent Application No. 2015/0301141, each of which is incorporated herein by reference in its entirety.

The signal evolutions that are acquired with MRF techniques are compared with a dictionary of signal models, or templates, that have been generated for different acquisition parameters from magnetic resonance signal models, such as Bloch equation-based physics simulations. The dictionary may also comprise a series of previously acquired known evolutions. This comparison allows estimation of the physical parameters, such as those mentioned above. As an example, the comparison of the acquired signals to a dictionary are typically performed using any a matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; N$_S$ is a number of spins; N$_A$ is a number of sequence blocks; N$_{RF}$ is a number of RF pulses in a sequence block; α is a flip angle; ϕ is a phase angle; R$_i$(α) is a rotation due to off resonance; R$_{RF_{ij}}$(α,ϕ) is a rotation due to RF differences; R(G) is a rotation due to a magnetic field gradient; T$_1$ is a longitudinal, or spin-lattice, relaxation time; T$_2$ is a transverse, or spin-spin, relaxation time; D is diffusion relaxation; E$_i$(T$_1$, T$_2$, D) is a signal decay due to relaxation differences; and M$_0$ is the magnetization in the default or natural alignment to which spins align when placed in the main magnetic field.

While E$_i$(T$_1$, T$_2$, D) is provided as an example, in different situations, the decay term, E$_i$(T$_1$, T$_2$, D), may also include additional terms, E$_i$(T$_1$, T$_2$, D, . . . ) or may include fewer terms, such as by not including the diffusion relaxation, as E$_i$(T$_1$, T$_2$) or E$_i$(T$_1$, T$_2$, . . . ). Also, the summation on "j" could be replace by a product on "j".

The dictionary may store signals described by, $$S_i = R_i E_i(S_{i-1}) \quad (2);$$

where S$_0$ is the default, or equilibrium, magnetization; S$_i$ is a vector that represents the different components of magnetization, M$_x$, M$_y$, and M$_z$ during the i$^{th}$ acquisition block; R$_i$ is a combination of rotational effects that occur during the i$^{th}$ acquisition block; and E$_i$ is a combination of effects that alter the amount of magnetization in the different states for the i$^{th}$ acquisition block. In this situation, the signal at the i$^{th}$ acquisition block is a function of the previous signal at acquisition block (i.e., the (i−1)$^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Conventional MRF dictionaries typically comprise massive data sets, especially when fine MRF dictionaries or MRF dictionaries with multiple components are taken into account (e.g., chemical exchange effects). These massive data sets can easily approach billions of elements, which pose a problem by placing significant constraints on conventional MRF methods that load, process, or store a MRF dictionary. Despite advancements in computational power, the emergence of large MRF dictionaries has complicated our ability to process the data using traditional matrix algorithms, such as the computationally expensive singular value decomposition (SVD).

The SVD process is a ubiquitous method for matrix dimensionality reduction and facilitation of data processing. However, the computational complexity of calculating the SVD is too expensive to carry out for large-sized dictionaries. For example, given a matrix of size m×n, (assuming m≤n), the computational complexity of calculating the SVD of the matrix is O (m$^2$n) floating-point operations (flops). This computational complexity proves to be too inefficient and expensive for compressing MRF dictionaries. Furthermore, to compute the SVD, a full MRF dictionary needs to first be generated and loaded into a computer's memory. In some instances, large MRF dictionaries may be too large to load into a computer memory.

Thus, as will be described, the present disclosure presents an approach for reducing the memory requirement of MRF dictionaries to achieve high resolution MRF maps from compressed MRF dictionaries. In one aspect, the compressed MRF dictionary is generated using a randomized singular value decomposition (rSVD), which may subsequently be used to generate tissue property maps. The present disclosure offers several advantages over conventional methods such as being able to generate the compressed MRF dictionary on-the-fly, or in other words, during generation of the MRF dictionary. This procedure allows one to avoid storing the entire MRF dictionary in a computer's memory prior to compression, which as mentioned above may be infeasible.

Referring to FIG. 1, a flowchart is provided for one implementation of a method 100 for using a compressed MRF dictionary to map a tissue property of a subject using magnetic resonance fingerprinting (MRF). The method 100 includes accessing a compressed MRF dictionary 102 that is, for example, generated from a randomized singular value decomposition (rSVD) of a MRF dictionary (D). As used herein, the term "accessing" may refer to any number of activities related to storing, retrieving, processing, or generating the compressed MRF dictionary using an MRF system 600 (described in FIG. 6), an external network, information repository, or mixtures thereof. The MRF system 600 is then used to acquire MRF data 104 from a tissue in a region of interest of a subject. Acquiring MRF data 104 may include, for example, performing a pulse sequence using a series of varied sequence blocks to elicit and a series of signal evolutions from a tissue in a region of interest.

The MRF data is recorded and compared to the compressed MRF dictionary 106 to match the observed signal evolutions with signal evolutions stored within the compressed MRF dictionary. Comparing the MRF data 106 to the compressed MRF dictionary may be performed in a number of ways, such as using a pattern or matching algorithm. In one non-limiting example, the inner products between the normalized measured time course of each pixel and all entries of the normalized dictionary are calculated, and the dictionary entry corresponding to the maximum value of the inner product is taken to represent the closest signal evolution to the acquired signal evolution.

The method 100 further includes generating a tissue property map 108 from the region of interest. Non-limiting examples of tissue property maps include relaxation parameters, tissue fractions, and proton density maps.

In some aspects, the compressed MRF dictionary has a memory requirement that is a factor of 15 to 1000 times smaller than a standard MRD dictionary. Despite the size concession, the compressed MRF dictionary is capable of rendering high resolution tissue property maps form the region of interest.

Figure 2:
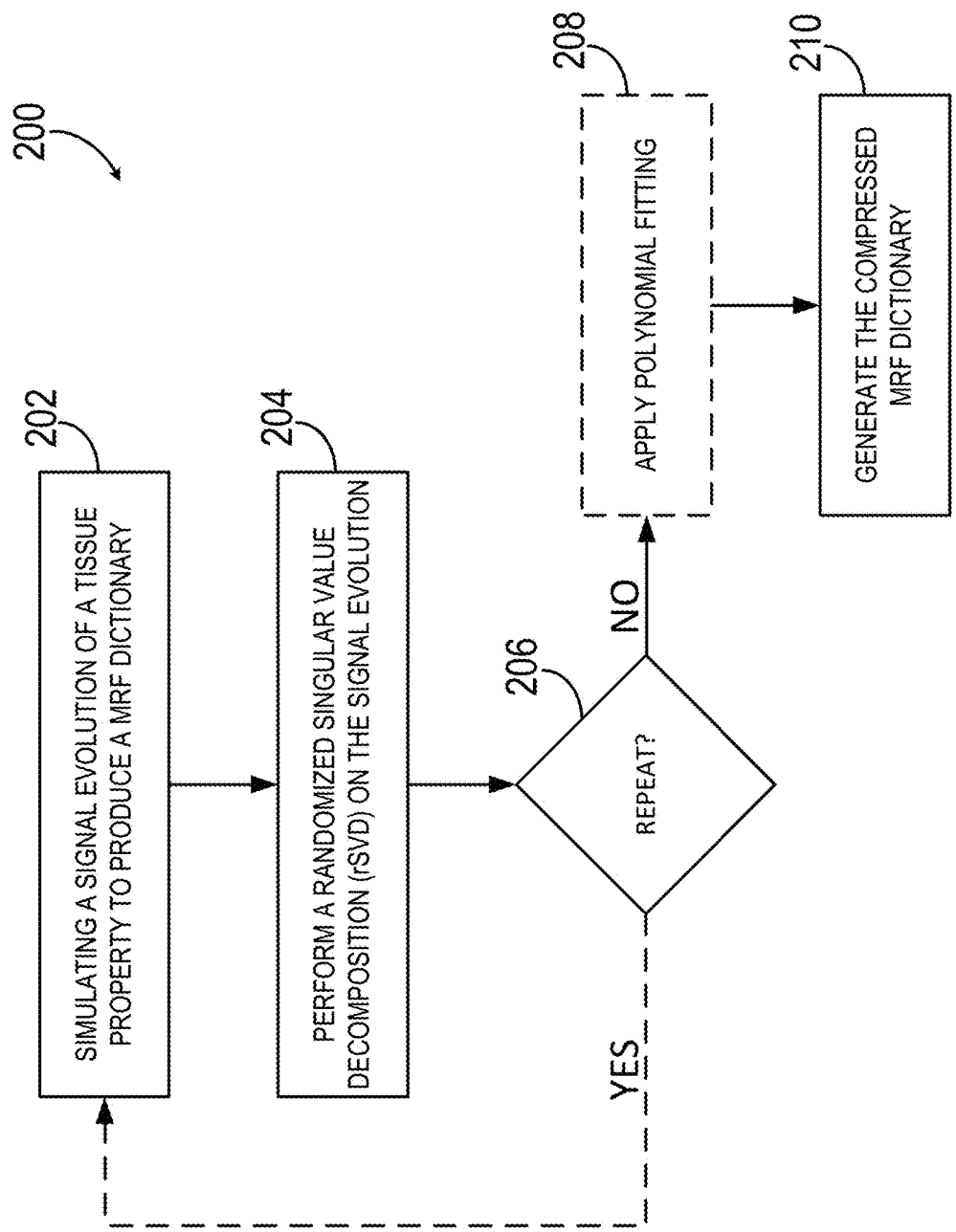
FIG. 2 is a schematic flow chart illustrating one non-limiting example of a process for accessing a compressed MRF dictionary in accordance with the present disclosure.

Referring to FIG. 2, a flowchart is provided for one implementation of a method for generating a compressed MRF dictionary 200 from a randomized singular value decomposition (rSVD). In one aspect, generating the compressed MRF dictionary 200 includes generating a signal evolution 202 of a tissue property within in a subject to produce a MRF dictionary. Generating the signal evolution 202 may include, for example, simulating the signal evolution using Bloch equation-based physics simulations, or acquiring 'known' signal evolutions and storing them in the MRF dictionary. The signal evolutions typically include a series of time parameters (m) and a series of tissue parameters (n) such as $T_1$, $T_2$, or off resonance parameters. The method 200 further includes performing a randomized singular value decomposition (rSVD) 202 on the MRF dictionary (D). This process may be optionally repeated 206 by, for example, generating a second signal evolution 202 and performing a second rSVD 204 on the second signal evolution, or the process may be stopped 206 to generate the compressed MRF dictionary. Method steps 202-206 may be repeated any number of times to generate the compressed MRF dictionary.

Unlike conventional SVD, the rSVD process allows for the compressed MRF dictionary to be generated on-the-fly (e.g., generating the compressed MRF dictionary at the same time as portions of the MRF dictionary (D) are being acquired/simulated). Therefore, this process avoids having to store the entire MRF dictionary (D) in the memory of a computer. In some instances, when the series of tissue parameters (n) is large, it may be beneficial to further compress the MRF dictionary. To accomplish this, the compressed MRF dictionary may be optionally fit to a polynomial 208 to further refine the compressed MRF dictionary. This process is further detailed in FIG. 4.

Figure 3:
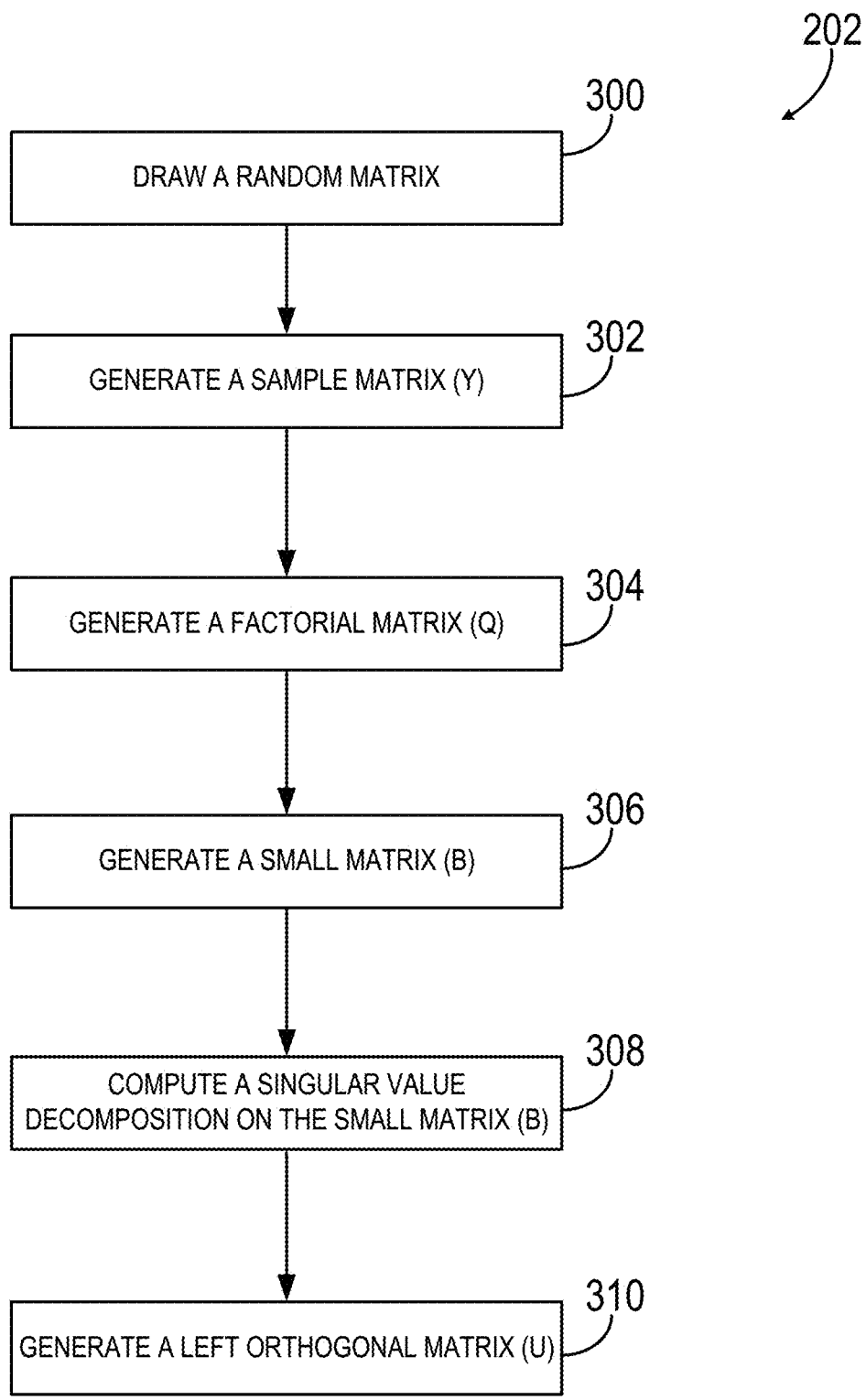
FIG. 3 is a schematic flow chart illustrating one non-limiting example of a process for performing a singular value decomposition on a MRF dictionary.

Referring to FIG. 3, a flowchart is provided for one implementation of a method for performing a randomized singular value decomposition (rSVD) on a MRF dictionary ($D \in \mathbb{C}^{m \times n}$). The method 202 may be initiated by drawing a random matrix ($\Omega \in \mathbb{C}^{n \times k}$) 300 that is configured with an n-th dimension that matches the number of tissue parameters (n) and a target rank dimension (k). In one aspect, the random matrix ($\Omega$) includes entries drawn from a random distribution, such as a set of independent identically distributed variables. A suitable random distribution may include, for example, a Gaussian matrix having a standard normal distribution with a mean of 0 and a variance of 1. The target rank dimension (k) may be selected as an input variable, where (k) is selected as a nonzero integer.

The method 202 further comprises generating a sample matrix ($Y \in \mathbb{C}^{m \times k}$) 302 by taking the matrix product between the random matrix ($\Omega$) and the MRF dictionary (D). In one aspect, the MRF dictionary (D) and the random matrix ($\Omega$) are processed using a power iteration technique, where the series of tissue parameters (n) are embedded into the target rank dimension (k) provided by:

$$Y=(DD^*)^q D\Omega \quad (3);$$

wherein D* is a conjugate transpose of the MRF matrix (D) and q is a power index comprising zero or a non-zero integer (i.e., q=0, 1, 2, 3 . . . ). A factorial matrix ($Q \in \mathbb{C}^{m \times k}$) is then generated 304 such that the columns of the factorial matrix (Q) form an orthonormal basis for the range of the sample matrix (Y). In one aspect, the factorial matrix (Q) is generated by:

$$Y=QQ^*Y \quad (4);$$

wherein Q* is the conjugate transpose of the sample matrix (Y).

A small matrix ($B \in \mathbb{C}^{k \times m}$) is then generated 306 by projecting the MRF dictionary (D) into a low-dimensional space using the factorial matrix (Q). In one aspect, the small matrix (B) is determined by:

$$B=Q^*D \quad (5);$$

A singular value decomposition (SVD) is then computed 308 using the small matrix (B) to obtain a series of right singular vectors and a series of singular values from the MRF dictionary (D). In one aspect, the singular value decomposition (SVD) of the small matrix (B) is calculated using a deterministic algorithm, such as one provided by:

$$B=\hat{U}SV^* \quad (6);$$

wherein V* is a right orthogonal matrix comprising the series of right singular vectors, S is a diagonal matrix comprising the series of singular values, and $\hat{U}$ is an approximate left orthogonal matrix comprising approximate left singular vectors. Next, the left singular vectors are obtained by generating a left orthogonal matrix (U) 310, which may be determined by:

$$U=Q^*\hat{U} \quad (7).$$

In one aspect, a compressed MRF dictionary may then be obtained by:

$$\hat{D} \approx USV^* \quad (8);$$

wherein the left orthogonal matrix (U), the diagonal matrix (S), and the right orthogonal matrix (V*) have dimensions provided by m×k, k×k, and k×n, respectively.

The choice of the power iteration index (q) depends on the rate of decay and the magnitude of the singular values of the MRF dictionary (D). When the spectrum of the dictionary matrix is flat, choosing a nonzero power iteration index helps reduce the interference of the singular vectors associated with the small singular values in the calculation, resulting in smaller approximation error. Specifically, the approximation error can be characterized as:

$$\mathbb{E}\|D-USV^*\|_2 \leq \left(1+4\sqrt{\frac{2\min\{m,n\}}{\frac{k}{2}-1}}\right)^{\frac{1}{2q+1}} \sigma_{\frac{k}{2}+1}, k > 2. \quad (9)$$

The larger the value of the power index, the smaller the approximation error. Now for some test signal x, the pattern matching can be calculated via $\max D^*x \approx \max(VS^*)(U^*x)$. The corresponding tissue property values can then be obtained by examining the index of the maximum against the tissue property value table used for the simulation of the MRF dictionary. Note that in real implementation, one does not need to pre-compute and store the entire dictionary D. For example, only one tissue property entry at a time may be calculated and processed on-the-fly to update Y and B for the calculation of U, S, and V, whose sizes are much smaller than that of the dictionary D, resulting in a significant reduction in the computer memory required.

Figure 4:
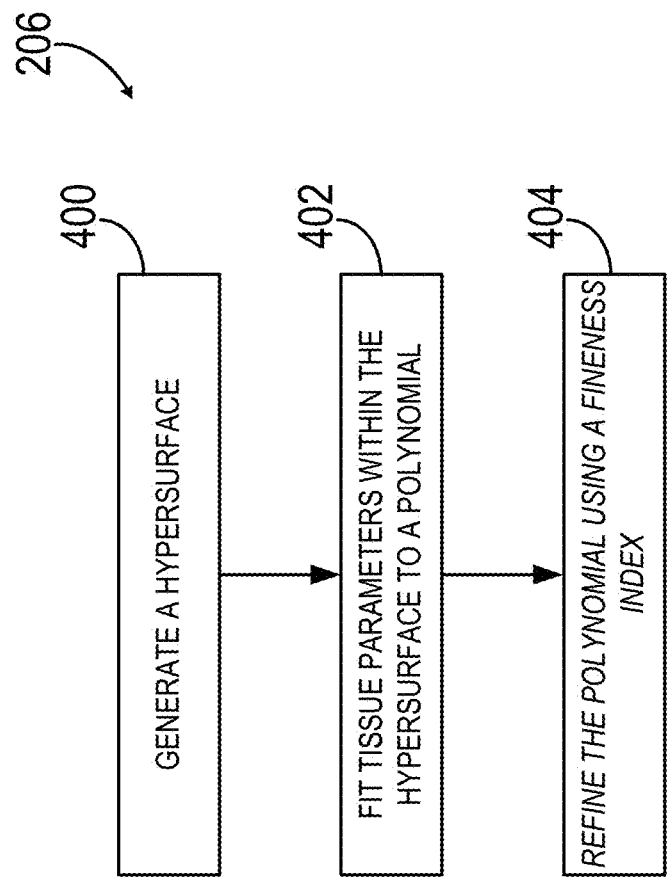
FIG. 4 is a schematic flow chart illustrating one non-limiting example of a process for fitting a polynomial to a compressed MRF dictionary.

In some instances where the series of tissue parameters (n) is large, it may be beneficial to further compress the MRF dictionary (D) using a fitting method, such as curve fitting. It is to be appreciated that the following fitting method may be performed on a compressed MRF dictionary or a MRF dictionary (D). Referring to FIG. 4, a flowchart is provided for one implementation of a method for applying curve fitting, such as polynomial fitting 206, to a MRF dictionary to generate a fitted MRF dictionary. The method 206 includes generating a hypersurface 400 by projecting at least a portion of the tissue parameters (n) within the compressed MRF dictionary into a k-dimensional space or a randomized SVD space (X). This may be determined by:

$$X = U^*\hat{D} \quad (10);$$

wherein U* is the conjugate transpose of the left orthogonal matrix (U). Tissue parameters (e.g., $T_1$ or $T_2$ values) within the hypersurface having the same values, or approximately the same values, are then fit 402 to a degree (d) polynomial to form a mesh grid. The fitted polynomial curves between each pair of adjacent grid points may then be further refined 404 evenly by applying a fineness index (t), resulting in a finer grid for each of the tissue parameters (n). That is, additional points in between the tissue parameters having the same values may be generated. In some aspects, the degree (d) polynomial depends on the target rank dimension (k) and the tissue parameters (n). For example, the number of dependent variables (n) should be no less than the number of independent variables including cross terms. This may be determined by:

$$\binom{k+d}{d} \leq n. \quad (11)$$

Figure 5:
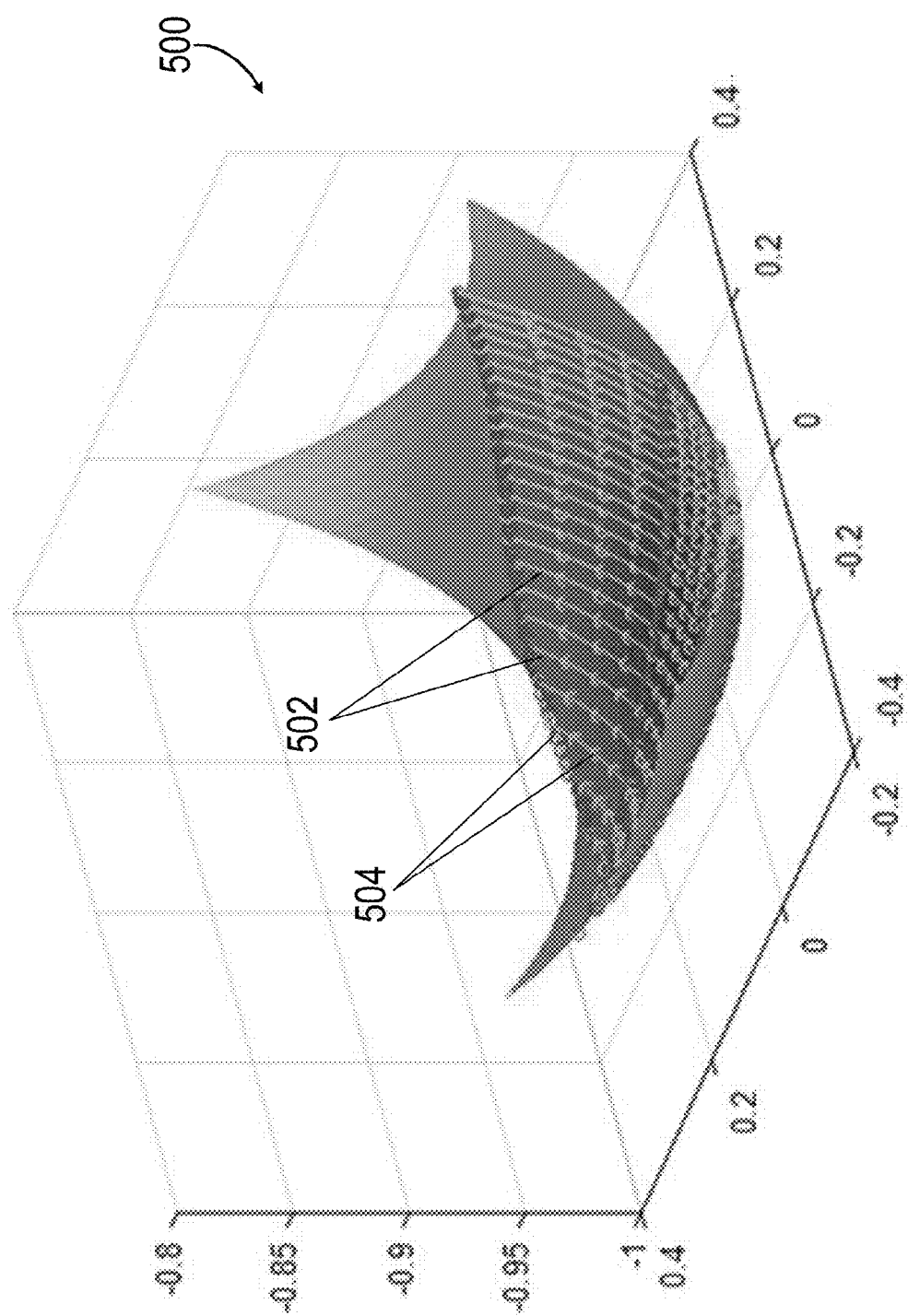
FIG. 5 is a visualization of a hypersurface formed by projecting a row space of a compressed MRF dictionary into a randomized singular value decomposition space, where the three axes are the three singular vectors used for approximation.

FIG. 5 shows one non-limiting example of a hypersurface 500 formed by projecting tissue parameters (n) into a randomized SVD space using a degree d=5 polynomial, a fineness index of t=4, and a target rank dimension k=3. The three axes are the three singular vectors used for approximation. Each curve 502 represents a tissue parameter (i.e. $T_1$ or $T_2$) having the same value across the hypersurface 500, and each circle 504 represents a fitted value determined using the fineness index (t). For example, the circles 504 in FIG. 5 represent the fitted values along different $T_1$ and $T_2$ curves 502, partitioning evenly each $T_1$, $T_2$ level segment into four parts using the fineness index (t).

In another aspect, tissue parameters (n) from a signal evolution (x) may be projected to the randomized SVD space ($\hat{x}$). This may be determined by:

$$\hat{x} = U^*x \quad (12).$$

The projected signal evolution $\hat{x}$ is then matched against all the T1, T2 fine grid points obtained above using a maximal correlation. For example, a maximal correlation may be used to identify the largest two coarse values (corresponding to the MRF dictionary) for each tissue property parameter. The two fitted and refined adjacent T1 curves between the two fitted adjacent T2 curves are examined and on each T1 curve the point with the largest correlation with $\hat{x}$ is found. The indices for each of these two points are recorded on the two T1 curves as (i) and (j) with i,j=1, . . . , p+1, where (p) is the number of partitions on each curve. The $T_2$ value corresponding to x can then be estimated as:

$$\alpha T_{2,1} + (1-\alpha)T_{2,2} \quad (13);$$

where $$\alpha = 1 - \frac{1+j-2}{2p};$$

and $T_{2,1}$ and $T_{2,2}$ are the $T_2$ values corresponding to the two $T_2$ curves. The $T_1$ value corresponding to x can be estimated similarly.

Figure 6:
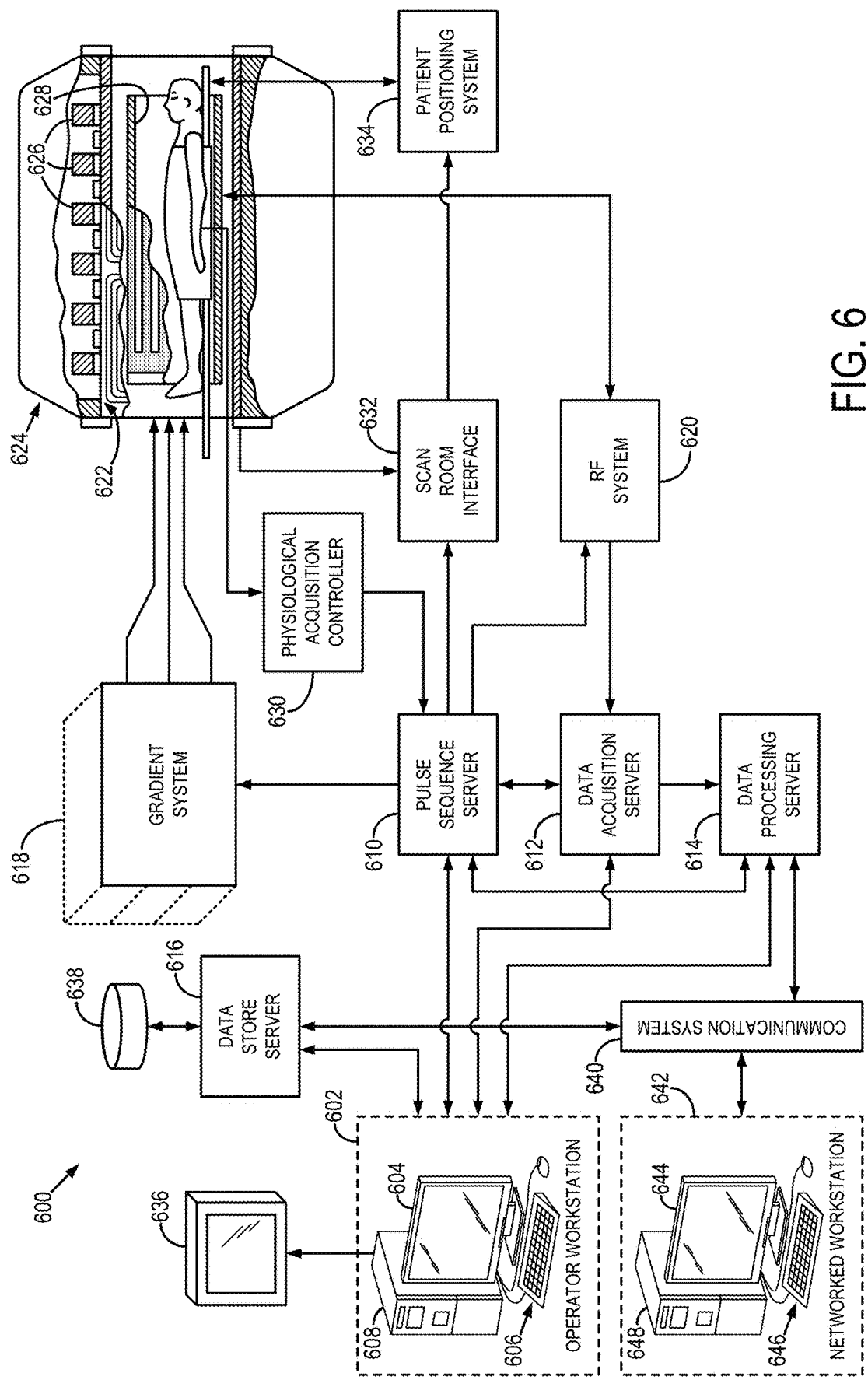
FIG. 6 is a block diagram of an example magnetic resonance fingerprinting ("MRF") system that can be used to implement the methods described in the present disclosure.

Referring particularly now to FIG. 6, an example of an MRF system 600 that can implement the methods described here is illustrated. The MRF system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRF system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRF pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (14);$$

and the phase of the received magnetic resonance signal may also be determined according to the following relationship:

$$\varphi = \tan^{-1}\left(\frac{Q}{I}\right). \qquad (15)$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRF system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

EXAMPLES

The following examples set forth, in detail, ways in which the spectroscopic magnetic resonance fingerprinting system 600 may be used or implemented, and will enable one of skill in the art to more readily understand the principles thereof. The following examples are presented by way of illustration and are not meant to be limiting in any way.

Compressed MRF with Randomized SVD

Two types of MRF sequences, an MRF-FISP sequence and a MRF-bSSFP sequence, are performed in this Examples section to evaluate the performance of the rSVD method for using a compressed MRF dictionary to produce high resolution tissue property maps.

Specifically, two MRF sequences are performed to scan in vivo human-brain data and simulate MRF dictionaries. Note that these two MRF sequences have different parameters, which results in different behaviors in the spectrum of the MRF dictionaries.

The full MRF-FISP dictionary simulated contains 3000 time frames and 5970 different tissue property combinations with $T_1$ values ranging from 10 ms to 2950 ms and $T_2$ values ranging from 2 ms to 500 ms with the constraint $T_2 \leq T_1$ as shown in Table 1.

image intensity variation because of coil sensitivity. The $T_1$ and $T_2$ maps using rSVD-MRF can now be obtained following the methods presented above, and the full $T_1$ and $T_2$ maps can be obtained through standard MRF pattern matching as the ground truth for comparison. In this case, we choose the low rank index k=30 and the power iteration index q=0, because the singular values for MRF-FISP dictionaries decay rapidly. One non-limiting example for performing rSVD on a MRF matrix is presented below.

Algorithm 1 Compressed MRF with Randomized SVD

1: Input: Dictionary atoms $d_i \in \mathbb{C}^m$, i = 1,...,n. Rank of approximation k. Normalized test sequences $x_i \in \mathbb{C}^m$, i = 1,...,p. Power iteration index q.
2: Initialization: $B = 0 \in \mathbb{C}^{k \times n}$, $W = 0 \in \mathbb{C}^{m \times k}$, $Z = 0 \in \mathbb{C}^{m \times k}$. $\Lambda = \emptyset$.
3: for j = 1,...,n do
4:     Draw a 1 × k Gaussian random vector ω
5:     $W = W + d_j \otimes \omega$
6:     if q ≠ 0 then
7:         $Z = Z + d_j \otimes d_j$
8:     end if
9: end for
10: $Y = Z^q W$
11: Y = QR
12: for j = 1,...,n do
13:     $B(:,j) = Q^* d_j$
14: end for
15: $B = \hat{U}SV^*$
16: $U = Q\hat{U}$
17: for j = 1,...,p do
18:     Update correlation coefficients in the compressed domain: $\bar{c} = S^* U^* x_j$
19:     $c = V\bar{c}$
20:     $\lambda_j = \arg\max_j \{c_j\}$
21:     $\Lambda = \Lambda \cup \lambda_j$
22: end for
23: Output: MRF parameter index set $\Lambda$.

TABLE 1

Ranges and Step Sizes for $T_1$ and $T_2$ in the MRF-FISP Dictionary

| FISP | Range | Step Size |
|---|---|---|
| $T_1$ | [10, 85] | 5 |
|  | [90, 990] | 10 |
|  | [1000, 1480] | 20 |
|  | [1500, 2000] | 50 |
|  | [2050, 2950] | 100 |
| $T_2$ | [2, 8] | 2 |
|  | [10, 145] | 5 |
|  | [150, 190] | 10 |
|  | [200, 500] | 50 |

All values in milliseconds (ms).

A healthy volunteer was scanned on a Siemens Skyra 3T scanner (Siemens Healthcare, Erlangen, Germany) with a 20-channel head receiver coil array for 45 s using the MRF-FISP sequence and spiral sampling pattern with an acceleration factor of 48 (one out of 48 spiral interleaves per repetition MRF-FISP acquisition), a matrix size of 256×256, and a field of view of 30×30 cm². The collected spiral data for each coil were reconstructed using the non-uniform fast Fourier transform with an independently measured spiral trajectory to correct the gradient imperfection. Reconstructed images from all individual coils were then combined using the adaptive coil combination method and scaled to the coil sensitivity map to compensate for the The full MRF-bSSFP dictionary used contains 500 time frames, 3312 different tissue property combinations with $T_1$ values ranging from 20 ms to 5900 ms, $T_2$ values ranging from 5 ms to 2900 ms with the constraint $T_2 \leq T_1$, as shown in Table 2, and off-resonance frequencies ranging from −300 Hz to 300 Hz with a step size of 4 Hz.

A healthy volunteer was scanned on a Siemens Espree 1.5T scanner (Siemens Healthcare, Erlangen, Germany) with a 4-channel head receiver coil array for 20 min using the MRF-bSSFP sequence with the conventional multi-shot Cartesian sampling pattern with no acceleration, a matrix size of 128×128, and a field-of-view of 25×25 cm2. The collected data for each coil were reconstructed using standard inverse fast Fourier transform. The reconstructed images from individual coils were then combined together and compensated for coil sensitivity. Singular values of MRF-bSSFP dictionaries tend to stay relatively flat. Therefore, we choose the low rank index k=100. In addition, we compare the performance of rSVD-MRF by varying the power iteration index q.

To demonstrate the efficiency of randomized SVD approach, the memory consumption was tested for both MRF sequences and compared with the conventional MRF with the SVD approach in MATLAB 2015b (MathWorks, Natick, Mass.) with the assistance of the memory profiler function on a Windows 10 system with an Intel Xeon 2.6 GHz CPU (Intel Corporation, Santa Clara, Calif.) and 64 Gb of memory.

To evaluate the performance of the compressed MRF dictionary using dictionary polynomial fitting combined with randomized SVD, a MRF-FISP sequence is used to simulate two MRF dictionaries, one compressed MRF dictionary and one fine, and in vivo human-brain data is collected from a healthy volunteer for comparison. A polynomial is then fit to the compressed dictionary and used to generate $T_1$ and $T_2$ maps, which are then compared with the results obtained from the fine dictionary.

The compressed MRF-FISP dictionary is simulated according to the Bloch equations for 3000 time frames with $T_1$ values varying from 20 ms to 1940 ms with a step size of 80 ms and $T_2$ values varying from 10 ms to 170 ms with a step size of 40 ms with the restriction $T_2 \leq T1$, resulting in a dictionary of size 3000×119. The fine MRF-FISP dictionary has the same number of time frames and the same $T_1$, $T_2$ ranges but with a four

TABLE 2

Ranges and Step Sizes for $T_1$ and $T_2$ for the MRF-bSSFP Dictionary

| bSSFP | Range | Step Size |
|---|---|---|
| $T_1$ | [20, 1980] | 20 |
|  | [2000, 5900] | 300 |
| $T_2$ | [5, 95] | 5 |
|  | [100, 400] | 50 |
|  | [500, 2900] | 200 |

All values in milliseconds (ms).

times finer step size.

The step sizes for $T_1$ and $T_2$ values are 20 ms and 10 ms, respectively, resulting in a dictionary of size 3000×1585. The in vivo brain scan of a healthy volunteer was obtained on a Siemens Skyra 3T scanner (Siemens Healthcare, Erlangen, Germany) with a 20-channel head receiver coil array using the MRF-FISP sequence and spiral sampling pattern with an acceleration factor of 48 (one out of 48 spiral interleaves per repetition MRF-FISP acquisition), a matrix size of 256×256, and a field off view of 30×30 cm². The collected spiral data for each coil were reconstructed using the non-uniform fast Fourier transform with an independently measured spiral trajectory for gradient imperfection correction. Reconstructed images from all individual coils were then combined and compensated for coil sensitivity variation. In addition, to apply polynomial fitting with randomized SVD, we set the rank of approximation for the randomized SVD to k=3, the power iteration index to q=0, the degree of the fitting polynomial to d=5, and the fineness index to t=4. Note that rank k and degree of polynomial can be varied, as long as they satisfy the condition $$\binom{k+d}{d} \leq n.$$

Moreover, we set t=4 because the bench-mark fine dictionary is four times finer than the compressed MRF dictionary. The $T_1$ and $T_2$ maps can then be calculated following the procedure described above and compared against the rSVD-MRF results using both the compressed MRF dictionary and the fine dictionary.

Note that informed consent was obtained before each scan, and all experiments were approved by our institutional review board.

FIG. 7(a-f) shows the results of applying the rSVD-MRF with power iteration index q=0 to a scanned health volunteer brain data set with an MRF-FISP dictionary with full resolution. Specifically, the reconstructed $T_1$, $T_2$ parameter maps and the difference maps using the direct MRF method and the rSVD-MRF method with rank k=10 and k=30 using the MRF-FISP sequence are displayed. The range of the $T_1$ values displayed is 10 ms to 2500 ms (anything beyond 2500 ms is displayed as 2500 ms), while the range of the $T_2$ value displayed is 2 ms to 250 ms for a better visualization (anything beyond 250 ms is displayed as 250 ms). In addition, the difference maps for both $T_1$ and $T_2$ values are scaled up ten times. The difference maps clearly demonstrate that the $T_1$ and $T_2$ maps from rSVD-MRF are in good agreement with the ground truth MRF maps, even though we have only used 1% (30 out of 3000) of the principal components. Explicitly, the relative error (the ratio between the Frobenius norm of the difference map and that of the ground truth map) between the $T_1$ maps from rSVD-MRF and the ground truth is only 0.58%, whereas the relative error between the $T_2$ maps is 1.09%. On the other hand, the performance of rSVD-MRF starts to break down if one pushes too much. For instance, when we choose rank k=10, the relative error increases to 5% for $T_1$ maps and to 11.66% for T2 maps.

We further show in FIG. 7(f) the comparison of the reconstruction fidelity of $T_1$ and $T_2$ maps using rSVD and the conventional SVD method. Both methods are compared with the ground truth MRF maps without compression with rank k varying from 5 to 50. The results from the rSVD method is averaged over 100 runs with standard deviation plotted. One can see from the plots that the relative error curves for both $T_1$ and $T_1$ maps using rSVD agree with the relative error curves using SVD when rank k is not chosen too small.

The results of applying the rSVD-MRF method with no power iteration (q=0) to the in vivo brain data of a healthy volunteer and the MRF dictionary using the MRF-bSSFP sequence are shown in FIG. 8(a-c). Here, we show the $T_1$, $T_2$, and off-resonance maps computed using both conventional MRF and the rSVD-MRF method with no power iteration. The left column of images corresponds to the $T_1$, $T_1$, and off-resonance maps using the conventional MRF. The middle column of images contains the $T_1$, $T_1$, and off-resonance maps using the rSVD-MRF method with no power iteration. The last column of images are the difference maps between the two approaches. For better visualization, the T1 values between 20 ms and 5000 ms are displayed, and the T1 difference map is scaled up ten times; the T2 values between 5 ms and 250 ms are displayed, and the T2 difference map is scaled up 2.5 times; and the off-resonance values between −100 Hz and 100 Hz are displayed. Although we have taken 20% of the principal components (100 out of 500), the difference maps exhibit a larger residual as compared to the FISP results because of the slower decay of the singular values in the bSSFP dictionary.

To remediate this problem, we set the power iteration index q=2. We notice that using q=2 provides a better approximation performance compared to the case q=0, without introducing too much computational overhead. The $T_1$ and $T_2$ maps can now be obtained following the approach outlined in Algorithm 1 and compared against the results obtained from the standard MRF approach, as shown in FIG. 9(a-c). Again, the maps for the standard MRF are shown in the first column, the maps for the rSVD-MRF are shown in the second column, and the difference maps are shown in the last column. By comparing the difference maps, the residuals are much smaller than that of the case when there is no power iteration involved. This demonstrates that the approximation error can be diminished significantly by incorporating a nonzero power iteration index when the singular value decay is not fast enough. Typically, setting the power iteration index q=2 is enough, as we have seen no significant improvement in in vivo experiments when setting q=3 and higher.

To demonstrate the advantage of the rSVD-MRF method, the memory consumption details calculated from the memory profiler of MATLAB are shown in Table 3.

TABLE 3

Memory Consumption for Calculating Dictionaries with Randomized SVD and Direct SVD Approach

|  | Direct Calculation | rSVD-MRF (q = 0) | rSVD-MRF (q = 2) |
| --- | --- | --- | --- |
| MRF-FISP | 1028.8 Mb | 1.6 Mb | N/A |
| MRF-bSSFP | 11,571 Mb | 764 Mb | 769.5 Mb |

The memory savings for calculating the SVD approximation to the MRF-FISP dictionary is almost 1000 times using our rSVD-MRF method against the standard MRF with SVD approach. For the MRF-bSSFP calculation using rSVD-MRF, we still get decent memory savings approximately 15 times compared to the MRF using SVD with or without power iteration, although not as significant as the MRF-FISP case.

We next demonstrate the possibility of constructing accurate tissue property maps from coarse MRF dictionaries combining rSVD-MRF with polynomial fitting. FIG. 5 shows a 3D visualization of the projected randomized SVD space of the coarse MRF-FISP dictionary with rank k=3, fitted with a degree d=5 polynomial, and fineness index t=4. The cyan and red curves represent different $T_1$ and $T_2$ values, respectively, and the circles represent fitted values along each curve, partitioning each $T_1$, $T_2$ coarse grid into four segments. The figure shows that the polynomial surface fits the projected compressed MRF dictionary well with fitting statistics $R_2$=1 and adjusted $R_2$=0.99.

The MRF results with different dictionaries are shown in FIG. 10(a-d) and FIG. 11(a-c). In FIG. 10(a-d), the $T_1$ and $T_2$ maps of the scanned human brain are obtained via the projected fine dictionary, the projected compressed MRF dictionary, the projected compressed MRF dictionary interpolated with piecewise linear functions, and the projected compressed MRF dictionary fitted with a degree 5 polynomial, respectively. A quality degradation is observed when the dictionary is too coarse. In particular, note that the $T_2$ map obtained from the compressed MRF dictionary shows significant loss of detail and exhibits a flat image appearance.

This, however, is improved by fitting a polynomial to the compressed MRF dictionary lattice. The results are more clearly displayed in the difference maps in FIG. 11(a-c), where the $T_1$, $T_2$ difference maps between the compressed and fine dictionaries approaches, the piecewise linear interpolated and the fine dictionary approaches, and the fitted and fine dictionary approaches are shown in the left, middle, and right columns, respectively. The $T_1$, $T_2$ map differences between the compressed MRF dictionary and the four times finer dictionary are significantly diminished by polynomial fitting in the rank 3 randomized SVD space. Specially, the relative error decreases from 3.68% to 2.06% for the T1 map and from 14.37% to 7.40% for the T2 map.

The present disclosure has described one or more preferred embodiments, and it should be appreciated that many equivalents, alternatives, variations, and modifications, aside from those expressly stated, are possible and within the scope of the invention.

We claim:

1. A method for generating a map of a tissue property in a subject using magnetic resonance fingerprinting (MRF) and a compressed MRF dictionary, the compressed MRF dictionary having a reduced memory requirement relative to a MRF dictionary (D), the method comprising:
   accessing a compressed MRF dictionary with a MRF system, the compressed MRF dictionary generated by performing a randomized singular value decomposition (rSVD) on a MRF dictionary (D), the compressed MRF dictionary comprising a series of singular vectors and a series of singular values from the MRF dictionary (D);
   acquiring MRF data from the tissue in the region of interest, and comparing the MRF data to the compressed MRF dictionary to identify the tissue property from the region of interest; and
   generating the map of the tissue property based on the tissue in the region of interest of the subject.

2. The method of claim 1 wherein performing a randomized singular value decomposition (rSVD) on the MRF dictionary (D) further comprises fitting the compressed MRF dictionary to a polynomial.

3. The method of claim 1 wherein the compressed MRF dictionary is generated during generation of the MRF dictionary (D).

4. The method of claim 3 wherein generating the MRF dictionary (D) further comprises generating a signal evolution based on the tissue in the region of interest of the subject, the signal evolution comprising a series of time parameters (m) and a series of tissue parameters (n).

5. The method of claim 2 wherein fitting the compressed MRF dictionary to the polynomial further comprises projecting the tissue parameters (n) of the compressed MRF dictionary into the randomized SVD space (X) to generate a hypersurface.

6. The method of claim 5 further comprising fitting the hypersurface with a degree (d) polynomial.

7. The method of claim 6 further comprising connecting at least a portion of the tissue parameters (n) within the hypersurface that have the same values using the degree (d) polynomial.

8. The method of claim 7 further comprising refining the degree (d) polynomial evenly t times, wherein t is a fineness index and comprises nonzero integers.

9. The method of claim 1 wherein performing the randomized singular value decomposition (rSVD) further comprises a first stage and a second stage, wherein the first stage comprises:
   drawing a random matrix ($\Omega \in C^{\wedge}(n \times k)$) having entries drawn from a distribution that comprises independent identically distributed variables and a target rank dimension (k) that comprises a nonzero integer;
   generating a sample matrix (Y) by processing the MRF dictionary (D) and the random matrix ($\Omega$) with a power iteration; and
   generating a factorial matrix (Q) comprising orthonormal columns for the range of the sample matrix (Y).

10. The method of claim 9 wherein the distribution for the random matrix ($\Omega \in C^{\wedge}(n \times k)$) comprises a random Gaussian matrix having a mean of 0 and a variance of 1.

11. The method of claim 9 wherein the sample matrix (Y) is generated using the power iteration provided by:

$$Y=(DD^*)^q D\Omega;$$

wherein $D^*$ is a conjugate transpose of the MRF matrix (D) and q is a power index comprising zero or a non-zero integer.

12. The method of claim 9 wherein the factorial matrix (Q) is generated by:

$$Y=QQ^**Y;$$

wherein Q* is the conjugate transpose of the sample matrix (Y).

13. The method of claim 1 wherein the singular vectors from the MRF dictionary (D) comprise left singular vectors and right singular vectors.

14. The method of claim 9 wherein the second stage of the randomized singular value decomposition (rSVD) comprises:
generating a small matrix (B) by projecting the MRF dictionary (D) into a low-dimensional space using the factorial matrix (Q);
computing a singular value decomposition on the small matrix (B) to obtain the series of right singular vectors and the series of singular values;
generating a left orthogonal matrix (U), the left orthogonal matrix comprising the series of left singular vectors; and
generating the compressed MRF dictionary, the compressed MRF dictionary comprising the series of right singular vectors, the series of singular values, and the left singular vectors.

15. The method of claim 14 wherein generating the small matrix (B) by projecting the MRF dictionary (D) into the low-dimensional space is determined by: $B=Q^**D$.

16. The method of claim 14 wherein calculating the singular value decomposition (SVD) of the small matrix (B) is determined by:

$$B=\hat{U}SV^*;$$

wherein V* is a right orthogonal matrix comprising the series of right singular vectors, S is a diagonal matrix comprising the series of singular values, and U is an approximate left orthogonal matrix comprising approximate left singular vectors.

17. The method of claim 14 wherein the left orthogonal matrix (U) comprising the left singular vectors is determined by $U=Q^**\hat{U}$.

18. The method of claim 14 wherein the compressed MRF dictionary (D^) is determined by:

$$D^\approx USV^*;$$

wherein the left orthogonal matrix (U), the diagonal matrix (S), and the right orthogonal matrix (V*) have dimensions provided by m×k, k×k, and k×n, respectively.

19. The method of claim 5 wherein projecting the row space of the compressed MRF dictionary into the randomized SVD space (X) is determined by:

$$X=U^*D^;$$

wherein U* is the conjugate transpose of the left orthogonal matrix (U).

20. A method for generating a map of a tissue property in a subject using magnetic resonance fingerprinting (MRF), the method comprising:
acquiring MRF data from a region of interest in a subject by performing a pulse sequence using a series of varied sequence blocks to elicit a series of signal evolutions;
applying curve fitting to at least a portion of a MRF dictionary to generate a fitted MRF dictionary; and
comparing the MRF data to the fitted MRF dictionary to generate a tissue property map from the region of interest.

21. The method of claim 20 wherein applying the curve fitting to the MRF dictionary further comprises fitting a degree (d) polynomial to the MRF dictionary.

22. The method of claim 21 wherein fitting the degree (d) polynomial further comprises generating a hypersurface by projecting at least a portion of the MRF dictionary into a k-dimensional space, and fitting the degree (d) polynomial to the hypersurface.

23. The method of claim 21 further comprising refining the degree (d) polynomial evenly t times, wherein t is a fineness index and comprises nonzero integers.

24. The method of claim 20 wherein applying curve fitting to generate the fitted MRF dictionary further comprises maximal correlation.

25. A magnetic resonance fingerprinting (MRF) system comprising:
a magnet system configured to generate a polarizing magnetic field about at least a portion of a subject;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array;
a computer system programmed to:
access a compressed MRF dictionary with the MRF system, the compressed MRF dictionary generated by performing a randomized singular value decomposition (rSVD) on a MRF dictionary (D), the compressed MRF dictionary comprising a series of singular vectors and a series of singular values from the MRF dictionary (D);
acquire MRF data from the tissue in the region of interest, and comparing the MRF data to the compressed MRF dictionary to identify the tissue property from the region of interest; and
generate the map of the tissue property based on the tissue in the region of interest of the subject.

* * * * *